United States Patent
Fan et al.

(10) Patent No.: US 8,582,301 B2
(45) Date of Patent: Nov. 12, 2013

(54) MOUNTING BRACKET

(75) Inventors: Chen-Lu Fan, New Taipei (TW); Li-Ping Chen, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 111 days.

(21) Appl. No.: 13/186,754

(22) Filed: Jul. 20, 2011

(65) Prior Publication Data
US 2012/0181241 A1  Jul. 19, 2012

(30) Foreign Application Priority Data

Jan. 14, 2011 (TW) .................................. 100101329

(51) Int. Cl.
*H05K 5/00* (2006.01)
(52) U.S. Cl.
USPC .......................................... 361/724; 248/200
(58) Field of Classification Search
USPC .......... 211/26, 26.2; 312/223.1, 223.2, 257.1, 312/263, 265.5; 248/27.1, 200, 300; 361/724
See application file for complete search history.

(56) References Cited

U.S. PATENT DOCUMENTS

| | | | | |
|---|---|---|---|---|
| 5,584,396 | A * | 12/1996 | Schmitt | 211/26 |
| 5,912,799 | A * | 6/1999 | Grouell et al. | 361/679.32 |
| 5,929,376 | A * | 7/1999 | Doun et al. | 174/369 |
| 6,038,126 | A * | 3/2000 | Weng | 361/679.01 |
| 6,305,986 | B1 * | 10/2001 | Hwang | 439/607.44 |
| 6,362,968 | B1 * | 3/2002 | Lajara et al. | 361/752 |
| 6,580,604 | B1 * | 6/2003 | McAnally et al. | 361/679.4 |
| 6,728,099 | B1 * | 4/2004 | Tsang et al. | 361/678 |
| 6,853,551 | B2 * | 2/2005 | Baar et al. | 361/679.33 |
| 7,177,145 | B2 * | 2/2007 | Carlson et al. | 361/679.32 |
| 8,189,337 | B2 * | 5/2012 | Peng et al. | 361/727 |
| 2005/0128699 | A1 * | 6/2005 | Peng et al. | 361/686 |
| 2008/0013273 | A1 * | 1/2008 | Bailey et al. | 361/685 |
| 2008/0298008 | A1 * | 12/2008 | Fan et al. | 361/685 |
| 2010/0238618 | A1 * | 9/2010 | Chang et al. | 361/679.4 |

* cited by examiner

*Primary Examiner* — Darnell Jayne
*Assistant Examiner* — Hiwot Tefera
(74) *Attorney, Agent, or Firm* — Altis & Wispro Law Group, Inc.

(57) ABSTRACT

A mounting bracket includes a first side plate, a second side plate, a top plate, a bottom plate, a pair of dividing plates, and a pair of metal plates. The top plate is connecting top edges of the first side plate and the second side plate. The bottom plate connecting bottom edges of the first side plate and the second side plate. The dividing plates are located between the top plate and the bottom plate and parallel to the first side plate and the second side plate. The metal plates are mounted on the first side plate and the second side plate respectively. The mounting bracket further includes a first accommodating space defined between the first side plate and one of the dividing plates, and a second accommodating space defined between the second side plate and the other one of the dividing plates.

3 Claims, 2 Drawing Sheets

MOUNTING BRACKET

BACKGROUND

1. Technical Field

The present disclosure relates to a mounting bracket applicable to a computing device.

2. Description of Related Art

Computing devices (e.g., personal computers, servers, etc.) usually use a mounting bracket to accommodate a circuit board, a power supply, and fans. The mounting bracket includes a pair of side plates, a top plate connecting top edges of the side plates, and a bottom plate connecting bottom edges of the side plates. A circuit board is attached on the bottom plate. The power supply unit is attached to an inner side of one of the side plates. After the power supply is powered on, the power supply supplies power to the circuit board, the fans and other electric components in the computing device. Then the computing device powers on and starts to work. However, the mounting bracket can usually only accommodate one power supply. If the power supply stops functioning, the computing device cannot be powered on and cannot work. Furthermore, the mounting bracket has no electromagnetic interference (EMI) resistant members, which may result in EMI effect.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
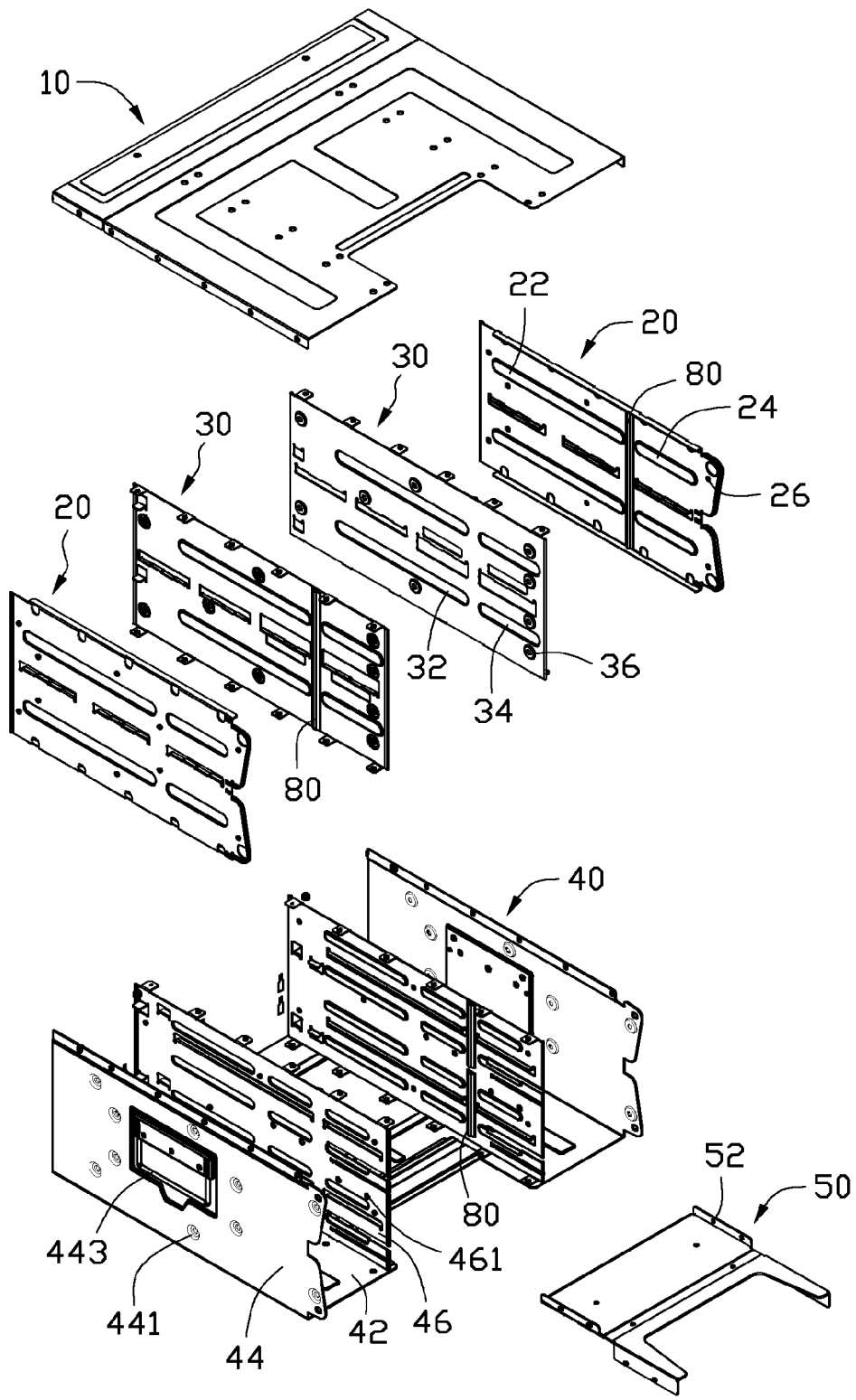
FIG. 1 is an exemplary embodiment of an exploded view of a mounting bracket.

Referring to FIG. 1, an embodiment of a mounting bracket includes a top plate 10, a pair of outer metal plates 20, a pair of inner metal plates 30, a holder 40, a supporting plate 50, and a plurality of EMI resistant rods 80.

Each of the outer metal plates 20 includes at least one first elongated protrusion 22 and at least one second elongated protrusion 24. The at least one first elongated protrusion 22 and the at least one second elongated protrusion 24 are located at substantially the same height. The at least one second elongated protrusion 24 is shorter than the at least one first elongated protrusion 22. One of the plurality of EMI resistant rods 80 is attached on the inner side of each of the outer metal plates 20 and is located between the at least one first elongated protrusion 22 and the at least one second elongated protrusion 24. One of the plurality of EMI resistant rods 80 is perpendicular to the at least one first elongated protrusion 22 and the at least one second elongated protrusion 24. A plurality of first mounting holes 26 are defined in each of the outer metal plates 20.

Each inner metal plate 30 has a shape similar to the shape of each outer metal plate 20. Each inner metal plate 30 includes at least one third elongated protrusion 32 and at least one fourth elongated protrusion 34. The at least one third elongated protrusion 32 and the at least one fourth elongated protrusion 34 are located at substantially the same height. The at least one fourth elongated protrusion 34 is shorter than the at least one third elongated protrusion 32. Another one of the plurality of EMI resistant rods 80 is attached on each of the inner metal plates 20 and located between the at least one third elongated protrusion 32 and the at least one fourth elongated protrusion 34. Another one of the plurality of EMI resistant rods 80 is perpendicular to the at least one third elongated protrusion 32 and the at least one second elongated protrusion 34. A plurality of second mounting holes 36 are defined in each of the inner metal plates 30.

The holder 40 includes a bottom plate 42 with a shape similar to the shape of the top plate 10, a pair of side plates 44 perpendicularly extending from opposite sides of the bottom plate 42, and a pair of dividing plates 46. Each dividing plate 46 is substantially perpendicularly attached on the bottom plate and parallel to the side plates 44. A plurality of securing holes 441 are defined in each of the side plates 44 for securing each of the outer metal plates 20. A handle 443 is attached to an outside of each of the side plates 44, which facilitates users carrying the holder 40. A plurality of first fixing holes 461 is defined in each of the dividing plates 46. A plurality of second fixing holes 52 is defined in the flanges of the supporting plate 50 corresponding to the plurality of first fixing holes 461.

Figure 2:
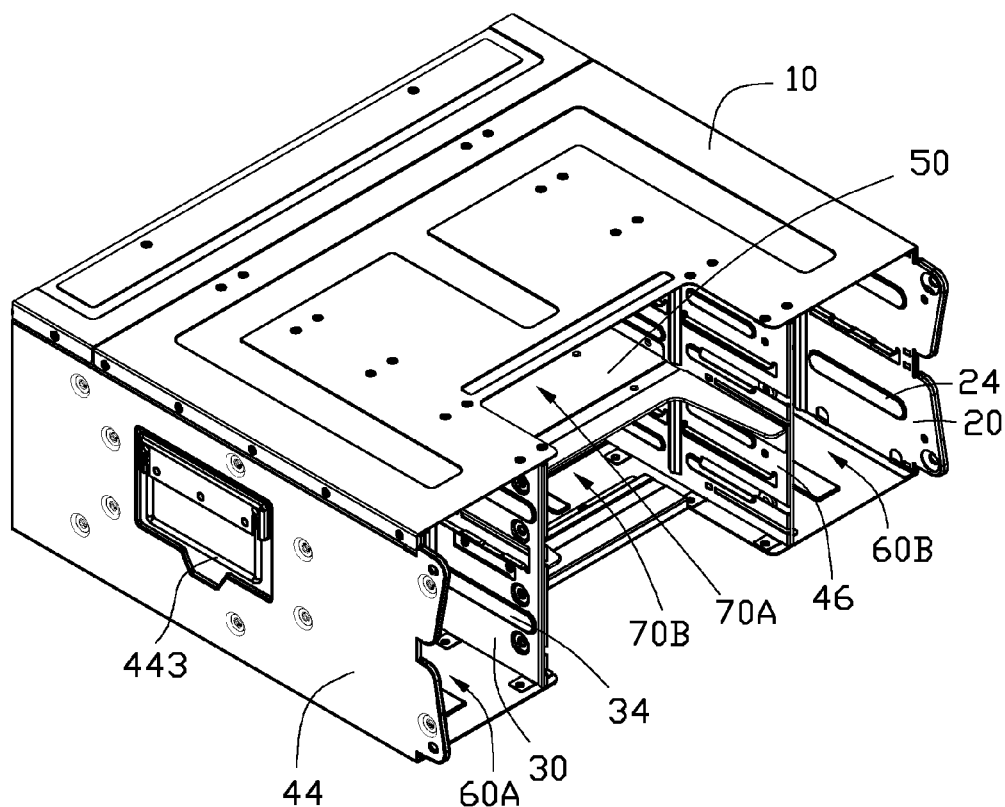
FIG. 2 is an exemplary embodiment of an assembled view of the mounting bracket of FIG. 1.

Referring to FIG. 2, in assembly, the outer metal plates 20 are secured to the inner sides of the side plates 44. The inner metal plates 30 are attached to the dividing plates 46 and face the outer metal plates 20. Screws (not shown) extend into the plurality of second fixing holes 52 and the plurality of first fixing holes 461 to secure the supporting plate 50 to the dividing plates 46. The supporting plate 50 is located between the dividing plates 46. The top plate 10 is securely attached on the top flanges of the side plates 44.

In one embodiment, the mounting bracket includes a first accommodating space 60A and a second accommodating space 60B. The first accommodating space 60A is defined between one of the outer metal plates 20 and one of the inner metal plates 30. The second accommodating space 60B is defined between the other outer metal plate 20 and the other inner metal plate 30. Each of the first accommodating space 60A and the second accommodating space 60B is used to accommodating a power supply (not shown). The mounting bracket further includes a first fan accommodating space 70A and a second fan accommodating space 70B. The first fan accommodating space 70A and the second fan accommodating space 70B are defined at opposite sides of the supporting plate 50, adjacent the top and bottom plates respectively, for accommodating fan modules.

The plurality of first mounting holes 26 and the plurality of second mounting holes 36 are used to secure power supplies in the holder 40. After the power supplies are mounted in the first accommodating space 60A and the second accommodating space 60B, the at least one first elongated protrusion 22 and the at least one second elongated protrusion 24 abut one side of the corresponding power supply. The at least one third elongated protrusion 32 and the at least one fourth elongated protrusion 34 abut another side of the corresponding power supply. The EMI resistant rods 80 also abut the power supply. Thus, the mounting bracket provides good EMI shielding ability.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A mounting bracket comprising:
   a first side plate;
   a second side plate;
   a top plate connecting top edges of the first side plate and the second side plate;
   a bottom plate substantially perpendicularly connecting to bottom edges of the first side plate and the second side plate, and substantially parallel to the top plate;
   a pair of dividing plates, located between the top plate and the bottom plate, substantially parallel to the first side plate and the second side plate;
   a pair of outer metal plates mounted on interior sides of the first side plate and the second side plate;
   a supporting plate located between the dividing plates, and substantially parallel to the top plate and the bottom plate; and
   a pair of inner metal plates attached to the dividing plates, each of the inner metal plates comprising a third elongated protrusion and a fourth elongated protrusion, wherein the third elongated protrusion and the fourth elongated protrusion are located at substantially the same height; an EMI resistant rod is attached on each of the pair of inner metal plates and located between the third elongated protrusion and the fourth elongated protrusion;
   wherein a first power supply accommodating space is defined between the first side plate and one of the dividing plates, and a second power supply accommodating space is defined between the second side plate and the other one of the dividing plates, a first fan accommodating space and a second fan accommodating space are defined at opposite sides of the supporting plate, adjacent to the top and bottom plates respectively, to accommodate an upper fan and a lower fan between a left power supply and a right power supply, respectively; and the pair of inner metal plates is located at the first power supply accommodating space and the second power supply accommodating space.

2. A mounting bracket comprising:
   a holder comprising a bottom plate, a first side plate, a second side plate, a first dividing plate, and a second dividing plate; the first side plate and the second side plate substantially perpendicularly extending from opposite side edges of the bottom plate; the first dividing plate and the second dividing plate connected to the bottom plate and substantially parallel to the first side plate and the second side plate, a supporting plate located between the dividing plates, and substantially parallel to the bottom plate;
   a pair of outer metal plates mounted on interior sides of the first side plate and the second side plate; wherein a first elongated protrusion and a second elongated protrusion protrudes from each of the pair of outer metal plates, and the first elongated protrusion and the second elongated protrusion are located at substantially the same height; the second elongated protrusion is shorter than the first elongated protrusion; and
   a first electromagnetic interference (EMI) resistant rod attached on each of the outer metal plates; wherein the first EMI resistant rod is located between the first elongated protrusion and the second elongated protrusion;
   wherein a first power supply accommodating space is defined between the first side plate and the first dividing plate, and a second power supply accommodating space is defined between the second side plate and the second dividing plate, a first fan accommodating space and a second fan accommodating space are defined at opposite sides of the supporting plate, to accommodate an upper fan and a lower fan between a left power supply and a right power supply, respectively.

3. The mounting bracket of claim 2, wherein the first EMI resistant rod is perpendicular to the first elongated protrusion and the second elongated protrusion.

* * * * *